United States Patent
Huang et al.

(10) Patent No.: US 9,607,826 B2
(45) Date of Patent: *Mar. 28, 2017

(54) SEMICONDUCTOR DEVICE MANUFACTURING METHODS AND METHODS OF FORMING INSULATING MATERIAL LAYERS

(71) Applicant: Taiwan Semiconductor Manufacturing Company, Ltd., Hsin-Chu (TW)

(72) Inventors: Gin-Chen Huang, New Taipei (TW); Tsai-Fu Hsiao, Hsin-Chu (TW); Ching-Hong Jiang, Hsin-Chu (TW); Neng-Kuo Chen, Hsin-Chu (TW); Hongfa Luan, Baoshan (TW); Sey-Ping Sun, Hsin-Chu (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/685,267

(22) Filed: Apr. 13, 2015

(65) Prior Publication Data

US 2015/0221504 A1    Aug. 6, 2015

Related U.S. Application Data

(63) Continuation of application No. 13/212,834, filed on Aug. 18, 2011, now Pat. No. 9,006,802.

(51) Int. Cl.
*H01L 21/02* (2006.01)
*H01L 29/66* (2006.01)
*H01L 21/324* (2006.01)

(52) U.S. Cl.
CPC ...... *H01L 21/02274* (2013.01); *H01L 21/022* (2013.01); *H01L 21/0228* (2013.01);
(Continued)

(58) Field of Classification Search
CPC ............ H01L 21/0228; H01L 21/2236; H01L 21/26506; H01L 21/26513; H01L 21/823431; H01L 21/845
(Continued)

(56) References Cited

U.S. PATENT DOCUMENTS

| | | |
|---|---|---|
| 4,692,344 A | 9/1987 | Kaganowicz et al. |
| 9,006,802 B2 * | 4/2015 | Huang .............. H01L 21/02164 257/288 |

(Continued)

OTHER PUBLICATIONS

Wikipedia, "Multigate device," http://en.wikipedia.org/wiki/FinFET, Aug. 3, 2011, pp. 1-5.

*Primary Examiner* — Chuong A Luu
*Assistant Examiner* — Rodolfo D Fortich
(74) *Attorney, Agent, or Firm* — Slater Matsil, LLP

(57) ABSTRACT

Semiconductor device manufacturing methods and methods of forming insulating material layers are disclosed. In one embodiment, a method of forming a composite insulating material layer of a semiconductor device includes providing a workpiece and forming a first sub-layer of the insulating material layer over the workpiece using a first plasma power level. A second sub-layer of the insulating material layer is formed over the first sub-layer of the insulating material layer using a second plasma power level, and the workpiece is annealed.

20 Claims, 3 Drawing Sheets

(52) U.S. Cl.
CPC .. *H01L 21/02164* (2013.01); *H01L 21/02332* (2013.01); *H01L 21/324* (2013.01); *H01L 29/66795* (2013.01)

(58) Field of Classification Search
USPC ............... 257/288, E29.255, E21.24, E21.19
See application file for complete search history.

(56) References Cited

U.S. PATENT DOCUMENTS

| | | |
|---|---|---|
| 2003/0186561 A1 | 10/2003 | Law et al. |
| 2004/0099903 A1* | 5/2004 | Yeo ................... H01L 29/66795 257/317 |
| 2011/0269287 A1 | 11/2011 | Tsai et al. |
| 2012/0070953 A1 | 3/2012 | Yu et al. |

* cited by examiner

SEMICONDUCTOR DEVICE MANUFACTURING METHODS AND METHODS OF FORMING INSULATING MATERIAL LAYERS

PRIORITY CLAIM

This application claims the benefit to and is a continuation of U.S. patent application Ser. No. 13/212,834, filed on Aug. 18, 2011 and entitled "Semiconductor Device Manufacturing Methods and Methods of Forming Insulating Material Layers," which application is incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Multiple gate field-effect transistors (MuGFETs) are a recent development in semiconductor technology which typically are metal oxide semiconductor FETs (MOSFETs) that incorporate more than one gate into a single device. The multiple gates may be controlled by a single gate electrode, where the multiple gate surfaces act electrically as a single gate, or by independent gate electrodes. One type of MuGFET is referred to as a FinFET, which is a transistor structure with a fin-like semiconductor channel that is raised vertically out of the silicon surface of an integrated circuit.

Conventional planar semiconductor devices often include gate dielectric materials that are fabricated using high temperature wet or dry thermal oxidation, which are processes that consume a relatively large amount of a silicon substrate by the combination of oxygen and the silicon substrate in a top-down process that forms silicon oxide. However, FinFETs and other multiple gate devices have a limited amount of silicon on their fin structures, and particularly as devices are reduced in size, consumption of the semiconductive fins of FinFETs and other MuGFETs during oxidation processes needs to be controlled carefully.

BRIEF DESCRIPTION OF THE DRAWINGS

For a more complete understanding of the present disclosure and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments of the present disclosure and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure provide low silicon-consumption methods of forming high quality insulating material layers. The insulating material layers may comprise silicon oxide (e.g., silicon dioxide) and are particularly beneficial for use as gate dielectric materials, especially for MuGFETs such as FinFETs, in which silicon consumption of fins of the devices may be a concern during gate dielectric formation.

Figure 1:
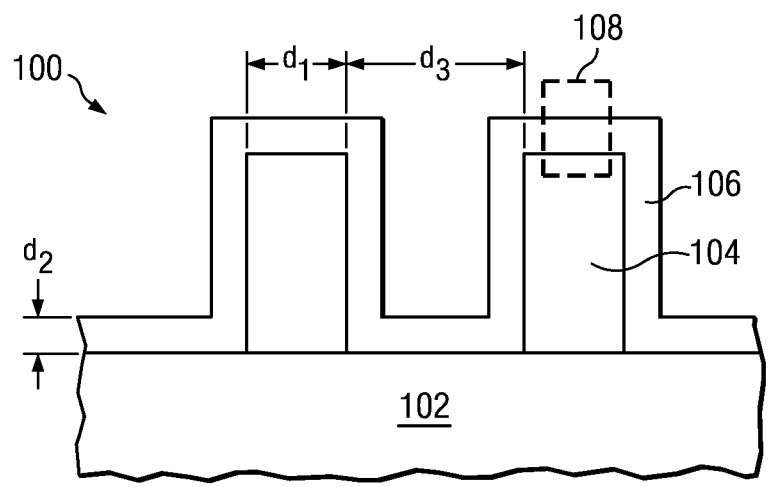
FIG. 1 is a cross-sectional view of a FinFET semiconductor device in accordance with an embodiment of the present disclosure.

Referring first to FIG. 1, there is shown a cross-sectional view of a semiconductor device 100 comprising a FinFET in accordance with an embodiment of the present disclosure. The semiconductor device 100 includes a workpiece 102. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

At least one FinFET fin 104 comprising a semiconductive material is formed over the workpiece 102. The FinFET fins 104 may extend lengthwise (e.g., in and out of the paper as drawn) and the FinFET fins 104 may comprise silicon or other semiconductive materials. The FinFET fins 104 may comprise a width of dimension d1 that may comprise about 50 nm in some embodiments. The FinFET fins 104 may be larger or smaller than 50 nm depending on the application, for example. Dimension d1 of the FinFET fins 104 may comprise about 15 nm or less in some embodiments, as another example. The FinFET fins 104 may be spaced apart from one another by an amount or dimension d3 that may be substantially the same as dimension d1, for example. Alternatively, dimension d3 may be larger than dimension d1, or less than dimension d1. Some FinFET fins 104 may be more closely spaced to other FinFET fins 104 across a surface of the workpiece 102, for example, not shown.

An insulating material layer 106 is formed over the FinFET fins 104 and over the top surface of the workpiece 102, as shown in FIG. 1. Methods of forming the insulating material layer 106 advantageously comprise consuming a minimal amount of the FinFET fin 104 material in accordance with embodiments of the present disclosure. The insulating material layer 106 is formed wherein substantially the same amount of semiconductive material of the FinFET fins 104 is consumed for closely spaced FinFET fins 104 in some regions and widely spaced FinFET fins 104 in other regions of the workpiece 102 during the formation of the insulating material layer 106, for example, not shown. The thickness of the insulating material layer 106 may comprise a dimension d2 comprising about 100 Angstroms or less in some embodiments, although alternatively, dimension d2 may comprise other values. The insulating material layer 106 is formed in a two-step deposition process; a first atomic layer deposition (ALD) process 116 (see FIG. 2) and a second ALD process 118, which is followed by an anneal process 120 in accordance with some embodiments of the present disclosure, to be described further herein. The insulating material layer 106 is also referred to herein as a composite insulating material layer.

Figure 2:
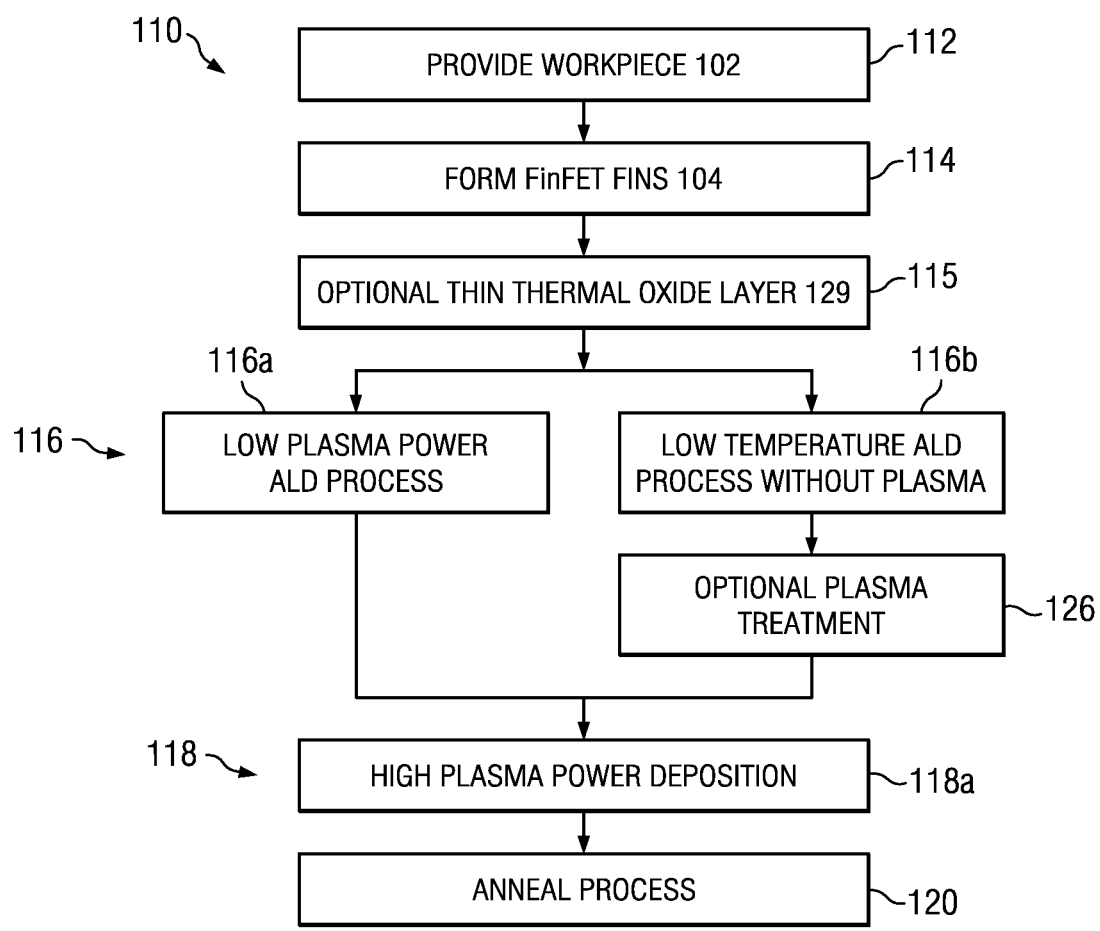
FIG. 2 is a flow chart illustrating methods of forming insulating material layers in accordance with embodiments of the present disclosure.
Figure 3:
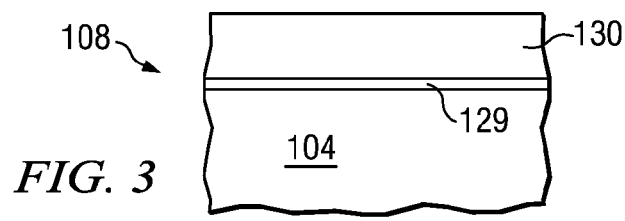
FIGS. 3 through 5 show cross-sectional views of methods of forming insulating material layers at various stages of manufacturing.
Figure 4:
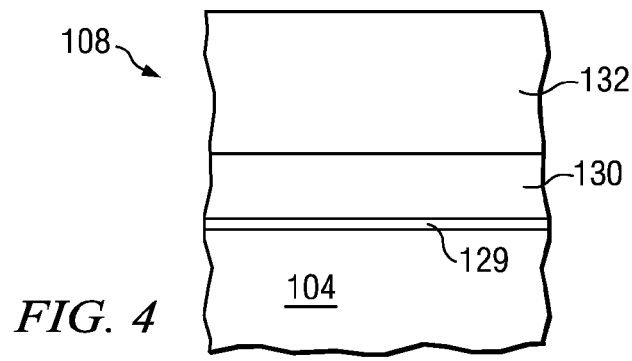
Figure 5:
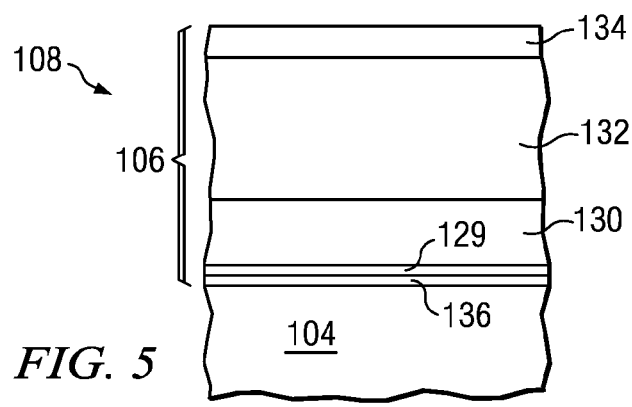

FIG. 2 is a flow chart 110 illustrating methods of forming insulating material layers 106 in accordance with embodiments of the present disclosure. FIGS. 3 through 5 show cross-sectional views of methods of forming insulating material layer 106 at various stages of the manufacturing process. FIGS. 3 through 5 show more detailed cross-sectional views of region 108 of FIG. 1, which shows a top portion of the FinFET fins 104 and the insulating material layer 106 disposed thereon.

To form the insulating material layer 106, first, the workpiece 102 is provided (step 112 of FIG. 2). FinFET fins 104 are formed (step 114) over the workpiece 102, e.g., at a top surface of the workpiece 102, as shown in FIG. 1. The FinFET fins 104 may be formed on a semiconductive layer of a workpiece 102 comprising an SOI substrate, as one example, although other methods may be used to form the FinFET fins 104. Insulating material layer 106 is then formed over the FinFET fins 104 and over exposed portions of the workpiece 102 using the following manufacturing steps.

An optional thin thermal oxide layer 129 may first be formed (step 115 of FIG. 2) over the FinFET fins 104 and the workpiece 102, as shown in FIG. 3. The thin thermal oxide layer 129 may be formed by an in-situ steam generation (ISSG) treatment, as an example. The thin thermal oxide layer 129 may comprise about 20 Angstroms or less of silicon oxide, for example. The thin thermal oxide layer 129 may alternatively be formed using other methods and may comprise other dimensions. The optional thin thermal oxide layer 129 improves an interface of a surface of the FinFET fins 104 in some embodiments.

A first ALD process 116 is used to form a first insulating layer 130 over the FinFET fins 104 and the workpiece 102 (or over the optional thin thermal oxide layer 129, if included) using a first plasma power level. The first ALD process 116 may comprise a low plasma power ALD process 116a or a low temperature ALD process without plasma 116b, as shown in FIG. 2. A second ALD process 118 comprising a high power plasma deposition 118a is used to form a second insulating layer 132 (see FIG. 4) over the first insulating layer 130 using a second plasma power level. The second plasma power level is different than the first plasma power level, and in some embodiments, the second plasma power level is greater than the first plasma power level. The workpiece 102 is then annealed using an anneal process 120, which may comprise a nitrogen or oxygen anneal treatment or an ISSG anneal treatment.

In some embodiments, the first ALD process 116 comprises a low plasma power level ALD process 116a. The low plasma power level ALD process 116a is performed over the FinFET fins 104 and the exposed portions of the workpiece 102 (or over the optional thin thermal oxide layer 129, if present), forming the first insulating layer 130, as shown in FIG. 3. The low plasma power level ALD process 116a may comprise exposing the FinFET fins 104 and workpiece 102 to a low plasma power ALD oxide deposition, such as a plasma ALD deposition of silicon oxide at a power of about 50 Watts or less, as examples, although alternatively, the low plasma power level ALD process 116a may comprise other plasma power levels. The low plasma power level ALD process 116a may comprise a plasma power level of about 15 Watts in some embodiments, as another example. The low plasma power level ALD process 116a may be performed for about 50 cycles for a time of about 2 seconds or less to form a first insulating layer 130 shown in FIG. 3 having a thickness of about 40 Angstroms or less, for example, although alternatively, the first insulating layer 130 may comprise other dimensions and may be formed using other numbers of ALD cycles and other amounts of time. The first insulating layer 130 may comprise silicon oxide in some embodiments, although other insulative materials may also be used. The first insulating layer 130 is also referred to herein as a first oxide layer or a first sub-layer of the insulating material layer 106.

The first insulating layer 130 provides a buffer layer for a subsequently formed second insulating layer 132 that is formed at a higher temperature or plasma power level. The first insulating layer 130 advantageously prevents an excessive amount of the semiconductive material of the FinFET fins 104 from being consumed in subsequent manufacturing steps, such as the formation of the second insulating layer 132, in accordance with embodiments of the disclosure.

Next, a second ALD process 118 is used to form a second insulating layer 132 over the first insulating layer 130, as shown in FIG. 4. The second ALD process 118 may comprise a high power plasma deposition process 118a. The high power plasma deposition process 118a may comprise ALD at a power level of about 100 Watts or greater, for example. In some embodiments, the high power plasma deposition process 118a may be performed at about 500 Watts, as an example, although alternatively, other power levels of ALD processes may also be used to form the second insulating layer 132. The high power plasma deposition process 118a may be performed for about 10 to 100 cycles for a time of about 1 to 2 seconds or less to result in a thickness of a second insulating layer 132 of about 10 to 50 Angstroms or greater, as an example, although alternatively, the second insulating layer 132 may be formed using other numbers of ALD cycles and other amounts of time. In some embodiments, the thickness of the second insulating layer 132 may be about 60 Angstroms. For example, the high power plasma deposition process 118a may be performed at about 500 Watts for about 50 seconds to achieve a second insulating layer 132 comprising a silicon oxide layer having a thickness of about 60 Angstroms, in some embodiments. The second insulating layer 132 may be thicker than the first insulating layer 130 in some embodiments, for example, as shown in FIG. 4. The second insulating layer 132 may also be thinner than the first insulating layer 130 in other embodiments. Alternatively, the second insulating layer 132 may comprise other dimensions.

The second insulating layer 132 comprises silicon oxide in some embodiments. The second insulating layer 132 is also referred to herein as a second oxide layer or a second sub-layer of the insulating material layer 106. The second insulating layer 132 may comprise the same material as the first insulating layer 130, for example. Alternatively, the second insulating layer 132 may comprise a different material than the first insulating layer 130.

The high power plasma deposition process 118a in some embodiments produces a second insulating layer 132 that has a higher oxide film quality than the first insulating layer 130, for example. Advantageously, the strong plasma power of the high power plasma deposition process 118a may result in the underlying first insulating layer 130 becoming more dense (e.g., the density of the first insulating layer 130 is increased), resulting in improved oxide quality for the first insulating layer 130 and the overall insulating material layer 106 of the novel present disclosure.

Next, the workpiece 102 is annealed using an anneal process 120 (see FIG. 2), forming the structure shown in FIG. 5 in a cross-sectional view. In some embodiments, the workpiece 102 may be annealed using a nitrogen anneal treatment. If a nitrogen anneal treatment is used, the workpiece 102 may be exposed to a nitrogen ambient or a nitrogen environment at a temperature of about 1,000 degrees C. for about 10 seconds, for example. The workpiece 102 may also be annealed using an oxygen anneal treatment, as another example. Alternatively, the workpiece 102 may be annealed using an ISSG process for similar amounts of time and temperatures used for the nitrogen anneal treatment, as examples. Other types of anneal processes, temperatures, and anneal times may also be used for the anneal process 120, for example.

The anneal process 120 may result in the insulating material layer 106 comprising the structure shown in FIG. 5 in some embodiments. If the anneal process 120 comprises a nitrogen anneal treatment, an optional third insulating layer 134 comprising a thin layer of silicon oxynitride may be formed over the top surface of the second insulating layer 132, as shown in FIG. 5. The third insulating layer 134 may comprise a thickness of about 10 Angstroms or less. Alternatively, the third insulating layer 134 may comprise other materials and thicknesses. The formation of a nitride layer (e.g., the third insulating layer 134) may advantageously increase the dielectric constant of the insulating material layer 106 that forms a gate dielectric of the FinFET device 140 (see FIG. 6) in some embodiments.

An optional fourth insulating layer 136 comprising a high quality silicon oxide layer or film may be formed at the interface of the top surface of the FinFET fins 104 and the first insulating layer 130, as shown. The fourth insulating layer 136 may form beneath the optional thin thermal oxide layer 129, if present. The fourth insulating layer 136 may comprise a thickness of about 10 Angstroms or less, for example. The fourth insulating layer 136 comprises a region or film having improved quality. If the anneal process 120 comprises an ISSG anneal treatment, the interface quality between the FinFET fins 104 and the first insulating layer 130 may be changed by slightly oxidizing the FinFET fins 104 and forming the fourth insulating layer 136, so that the insulating material layer 106 functions more closely as a thermal oxide would function, which is beneficial in some applications. The fourth insulating layer 136 may also form if a nitrogen anneal treatment is used for the anneal process 120, for example.

Referring again to FIG. 2, in other embodiments, rather than using a first ALD process 116 comprising a low plasma power ALD process 116a to form the first insulating layer 130, a low temperature ALD process without plasma (see step 116b in the flow chart 110 of FIG. 2) may be used to form the first insulating layer 130. The low temperature ALD process without plasma 116b may comprise a chemical deposition ALD process, for example. The low temperature ALD process without plasma 116b may comprise a temperature of about 450° C. or less for about 50 ALD cycles, forming a first insulating layer 130 having a thickness of about 40 Angstroms, for example. The low temperature ALD process without plasma 116b may comprise a temperature of about 200 to 800 degrees C. in some embodiments, for example. Alternatively, the low temperature ALD process without plasma 116b may comprise other temperatures and numbers of ALD cycles and may form first insulating layers 130 having other thicknesses. Advantageously, the low temperature ALD process without plasma 116b forms a first insulating layer 130 that forms a buffer layer that minimizes silicon consumption of the underlying FinFET fins 104 during subsequent manufacturing steps.

In embodiments where a low temperature process without plasma 116b is used to form the first insulating layer 130, an optional plasma treatment 126 may be performed on the first insulating layer 130 after the formation of the first insulating layer 130. The optional plasma treatment 126 may comprise a power of about 50 Watts or less, as an example. The plasma treatment 126 may comprise a nitrogen or oxygen plasma treatment which is adapted to improve an oxide quality of the first insulating layer 130. The optional plasma treatment 126 may allow a deposition of a thicker insulating material layer 106 with a desired effective oxide thickness (EOT) for a gate dielectric material. The optional plasma treatment 126 may also advantageously enhance reliability of the insulating material layer 106 formed.

After the optional plasma treatment 126, the second ALD process 118 comprising the high power plasma deposition process 118a previously described herein is performed, and the workpiece 102 is annealed using the anneal process 120 also previously described herein, for example. The anneal process 120 improves the bulk oxide formed (e.g., the material of the first insulating layer 130 and second insulating layer 132), and removes any remaining charge that may have been caused during the plasma treatments (e.g., steps 116, 118, and/or 126). The anneal process 120 also improves the interface quality of the insulating material layer 106 formed, e.g., by the optional formation of the fourth insulating layer 136 comprising a dense, high-quality oxide, in some embodiments.

Advantageously, the novel insulating material layer 106 of the present disclosure consumes a minimal amount of the FinFET fin 104 material, due to the low plasma power ALD process 116a or low temperature ALD process without plasma 116b used. The well-controlled insulating material layer 106 formed may be combined in in situ ALD processing steps (116 and 118), resulting in the avoidance of a loading effect.

Figure 6:
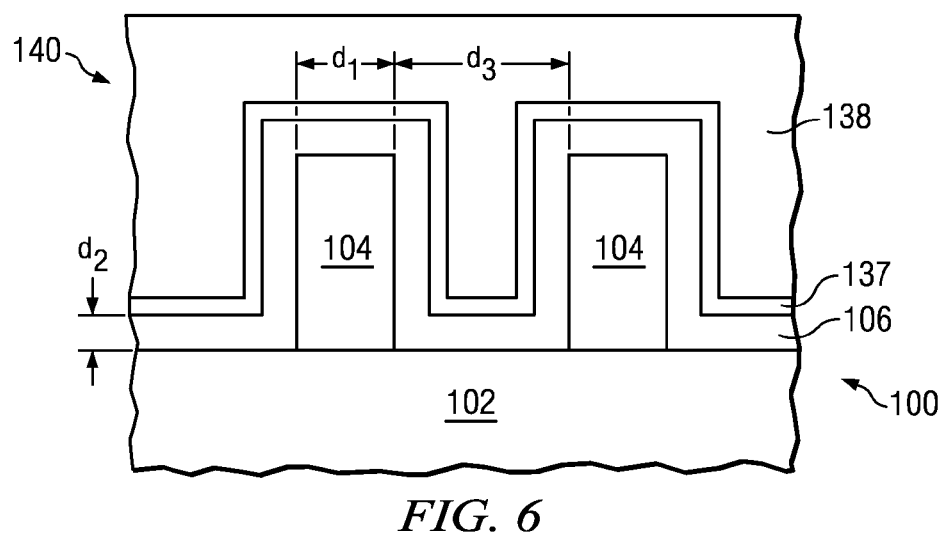
FIG. 6 is a cross-sectional view of a FinFET device after formation of a gate electrode over the novel gate dielectric of the present disclosure.

FIG. 6 is a cross-sectional view of a FinFET device 140 after the formation of a gate electrode material 138 comprising a conductor over the novel gate dielectric 106 of the present disclosure. In some embodiments, after the formation of the insulating material layer 106, a high dielectric constant (k) insulating material 137 may be deposited or formed over the insulating material layer 106, as shown in FIG. 6. The high k insulating material 137 may comprise about 50 Angstroms of hafnium oxide, as an example, although alternatively, the high k insulating material 137 may comprise other materials and dimensions. The widths of dimension d1 of FinFET fins 104 across a surface of a workpiece 102 have increased uniformity, regardless of the spacing (e.g., widely-spaced or closely-spaced) between adjacent FinFET fins 104, in accordance with embodiments of the disclosure. Better control of the widths of dimension d1 is provided for the FinFET fins 104 by the manufacturing methods described herein that are used to form the insulating material layer 106. This is because the described methods provide for better control of the amount of the FinFET fin 104 material that is consumed by the process of forming the insulating material layer 106.

Figure 7:
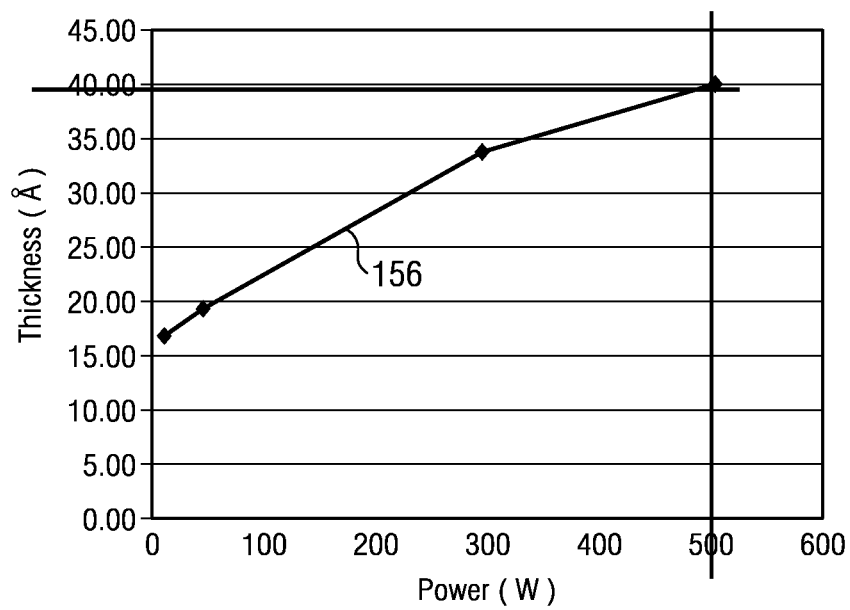
FIG. 7 is a graph of oxide thickness for a variety of plasma power levels.
Figure 8:
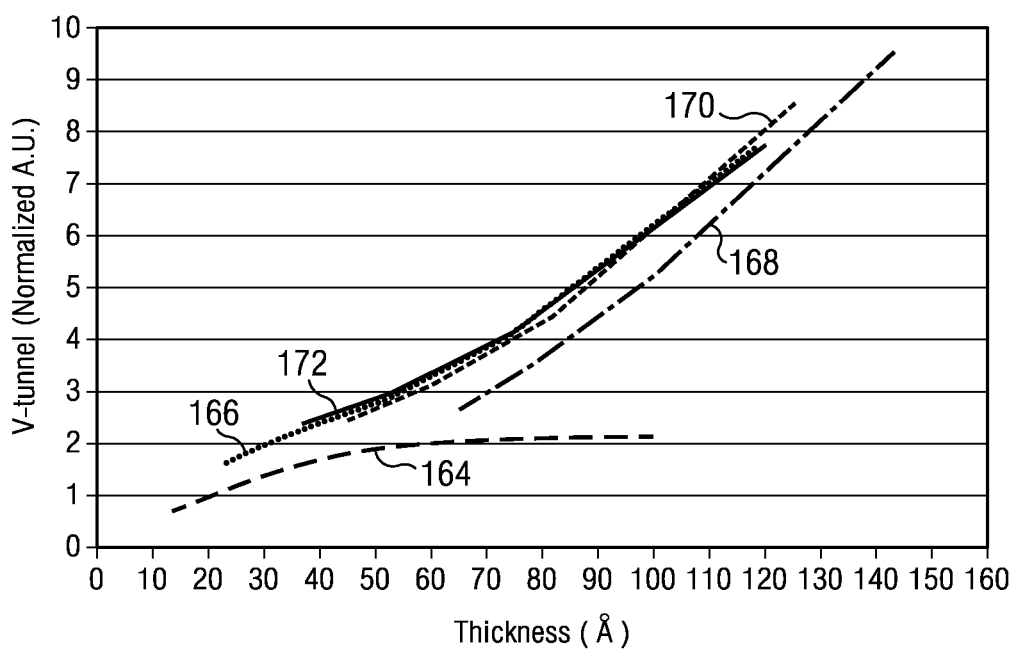
FIG. 8 is a graph illustrating the quality of oxide formed for various thicknesses in accordance with an embodiment of the present disclosure.

FIGS. 7 and 8 are graphs illustrating the effects of the various processing steps described herein on the formation of insulating material layers 106 in accordance with embodiments of the present disclosure. FIG. 7 is a graph 156 of oxide thickness for a variety of plasma power levels ranging from 15 watts to 500 Watts for an O2 plasma test on a blanket wafer for 100 cycles. The graph 156 illustrates that a higher plasma power would consume more silicon and convert it to SiO2.

FIG. 8 is a graph illustrating a quality of oxide formed for various thicknesses in accordance with an embodiment of the present disclosure. A measurement of V-tunnel in normalized arbitrary units (A.U.) is shown for a low power 15 Watt ALD process without plasma at 164. A measurement of V-tunnel is shown for about a 500 Watts ALD process with plasma at 166. A combination of a low plasma level first insulating layer 130 at about 15 Watts to form an initial first insulating layer 130 having a thickness of about 58.8 Angstroms and also a second insulating layer 132 formed at about 500 Watts is shown at 168. Similar deposition conditions but resulting in a first insulating layer 130 thickness of about 36.92 Angstroms is shown at 170, and a thickness of about 23.11 Angstroms of the first insulating layer 130 is shown at 172. FIG. 8 illustrates that the processing steps (low plasma power ALD process 116a+high plasma power deposition 118a) of the flow chart 110 of FIG. 2 can advantageously achieve the same quality as a high plasma power ALD process. The graphs in FIG. 8 also illustrate that an insulating material layer 106 comprising an excellent quality oxide is achievable by embodiments of the present disclosure.

Embodiments of the present disclosure include the manufacturing processes for the semiconductor devices 100 described herein and also semiconductor devices 100 manufactured using the processes described herein, for example. Some embodiments are particularly beneficial in applications where FinFETs 140 are used; however, the present disclosure also has useful application in other MuGFET devices and planar semiconductor devices 100, as well. Embodiments of the present disclosure are beneficial in applications wherein the FinFETs 140 comprise input/output (I/O) devices that may have gate dielectric materials that include a layer of high k insulating material 137 disposed over the insulating material layer 106 described herein, for example. The novel methods of forming gate dielectric materials 106 using a first ALD process 116, a second ALD process 118, and an anneal process 120 reduce consumption of a semiconductive material (e.g., such as FinFET fin 104 material in the examples described herein) beneath the gate dielectric 106 material during the formation of the gate dielectric 106 material. The novel methods described herein may be used to form many other types of insulating materials of semiconductor devices in other applications, for example.

In accordance with one embodiment of the present disclosure, a method of forming a composite insulating material layer of a semiconductor device includes providing a workpiece and forming a first sub-layer of the insulating material layer over the workpiece using a first plasma power level. A second sub-layer of the insulating material layer is formed over the first sub-layer of the insulating material layer using a second plasma power level, and the workpiece is annealed.

In another embodiment, a method of manufacturing a semiconductor device includes providing a workpiece, the workpiece including at least one FinFET fin disposed on a surface thereof. An insulating material layer is formed over the at least one FinFET fin using a first ALD process, a second ALD process, and an anneal process. The second ALD process comprises a different plasma power process than the first ALD process.

In yet another embodiment, a method of manufacturing a semiconductor device includes providing a workpiece and forming at least one FinFET fin over the workpiece. The method includes forming a gate dielectric over the at least one FinFET fin using a first ALD process, a second ALD process, and an anneal process. The second ALD process comprises a different plasma power level process than the first ALD process. A gate electrode is formed over the gate dielectric. The at least one FinFET fin, the gate dielectric, and the gate electrode comprise a FinFET device.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
    forming a fin structure protruding from a substrate;
    depositing a dielectric buffer layer on the fin structure using a first plasma power level;
    depositing a gate dielectric layer over the dielectric buffer layer, wherein the gate dielectric layer has an exposed top surface, and is deposited using a second plasma power level different from the first plasma power level; and
    annealing the fin structure while the gate dielectric layer top surface remains exposed to improve the interface quality of the gate dielectric layer.

2. The method of claim 1, wherein depositing the dielectric buffer layer comprises using a low temperature atomic layer deposition (ALD) process without plasma.

3. The method of claim 1, wherein depositing the dielectric buffer layer comprises an atomic layer deposition (ALD) process with a plasma power of less than about 50 W.

4. The method of claim 1, wherein depositing the gate dielectric layer comprises an atomic layer deposition process with a plasma power of greater than about 100 W.

5. The method of claim 1, wherein the process for depositing the dielectric buffer layer consumes less material of the fin structure than does the process for depositing the gate dielectric layer.

6. The method of claim 1, further comprising performing a plasma treatment after forming the dielectric buffer layer and before forming the gate dielectric layer.

7. The method of claim 1, wherein the step of annealing the fin structure forms another dielectric layer on the gate dielectric layer.

8. The method of claim 7, wherein the dielectric buffer layer and the gate dielectric layer comprise silicon oxide and the another dielectric layer comprises silicon oxynitride.

9. A method of manufacturing a semiconductor device, the method comprising:
   forming a fin disposed on a surface of a substrate;
   forming a first gate dielectric sub-layer on the fin using a first atomic layer deposition (ALD) process at a first plasma level;
   forming a second gate dielectric sub-layer on the first gate dielectric sub-layer using a second ALD process at a second plasma level; and
   performing an anneal process on the first and second gate dielectric sub-layers.

10. The method of claim 9, wherein the first plasma level is no plasma.

11. The method of claim 9, wherein the first plasma level is below about 50 W.

12. The method of claim 9, wherein the process for depositing the first gate dielectric sub-lay consumes less material of the fin than does the process for depositing the second gate dielectric sub-layer.

13. The method of claim 9, further comprising forming a thermal oxide layer on the fin before forming the first gate dielectric sub-layer.

14. The method of claim 9, wherein the second plasma level is above about 100 W.

15. The method of claim 9, further comprising forming a high k dielectric material over the fin, after the anneal process.

16. The method of claim 9, wherein the anneal process forms a silicon oxynitride layer on the second gate dielectric sub-layer.

17. A method of forming a semiconductor device, the method comprising:
   providing a workpiece comprising a semiconductor material;
   forming a first sub-layer of a gate dielectric layer over the workpiece using a first deposition process that is configured to consume a lesser amount of the semiconductor material relative to a second deposition process;
   forming a second sub-layer of the gate dielectric layer over the first sub-layer of the gate dielectric layer using the second deposition process; and
   annealing the workpiece after the forming the second sub-layer of the gate dielectric layer and while the second sub-layer of the gate dielectric layer is free of overlying.

18. The method of claim 17, wherein the first deposition process comprises a plasma power level of about 50 Watts or less, and wherein the second deposition process a plasma power level of about 100 Watts or greater.

19. The method of claim 17, wherein the step of annealing the workpiece improves a film quality at an interface of the gate dielectric layer.

20. The method of claim 17, wherein the step of forming a first sub-layer of a gate dielectric layer comprises an atomic layer deposition process at a first plasma level and the step of forming a second sub-layer of the gate dielectric layer comprises an atomic layer deposition process at a second plasma level higher than the first plasma level.

\* \* \* \* \*